United States Patent [19]

Nakadai

[11] Patent Number: 5,296,753
[45] Date of Patent: Mar. 22, 1994

[54] COMPARATOR CIRCUIT
[75] Inventor: Naotoshi Nakadai, Tokyo, Japan
[73] Assignee: Nec Corporation, Tokyo, Japan
[21] Appl. No.: 4,909
[22] Filed: Jan. 19, 1993
[30] Foreign Application Priority Data Jan. 20, 1992 [JP] Japan .................. 4-007024

[51] Int. Cl.$^5$ ............ H03K 17/60; H03K 5/153
[52] U.S. Cl. ......................... 307/362; 307/570/455
[58] Field of Search ........... 307/362, 270, 446, 455, 307/570

[56] References Cited
U.S. PATENT DOCUMENTS 5,075,581 12/1991 Kamata ...................... 307/570
5,134,319 7/1992 Yamaguchi ................. 307/570

Primary Examiner—Margaret R. Wambach
Attorney, Agent, or Firm—Whitham & Marhoefer

[57] ABSTRACT

A comparator circuit of the present invention comprises first and second bipolar type transistors for amplification of the input and reference voltages and first to fourth MOS type transistors for comparison and latching of the amplified input and reference voltages according to the first driving signal and fifth and sixth MOS type transistors provided between the first-/second bipolar transistors and the first to fourth MOS type transistors for turning on and off according to the second driving signal, all on a single stage.

4 Claims, 2 Drawing Sheets 5,296,753

COMPARATOR CIRCUIT

BACKGROUNDS OF THE INVENTION

1. Field of the Invention

The present invention relates to a comparator circuit to compare two input data and particularly relates to a comparator circuit embodied with a small number of elements.

2. Description of the Prior Art

Comparator circuits are commonly used in electronic circuits including those for A/D converters. With recent progress of high definition TVs and other sophisticated devices, higher precision A/D converters are required, and comparator circuits are also desired to have higher precision.

FIG. 4 shows an example of a conventional comparator circuit. This circuit was given in IEEE Journal of Solid-state Circuits (Vol. 3, No. 6, December 1988, Page 1346).

Referring to FIG. 4, this comparator circuit has a two-stage configuration with a differential pre-amplifier on the front stage and a comparison/latch circuit on the rear stage. At the differential pre-amplifier on the front stage, input voltage $V_{IN}$ and reference voltage $V_{ref}$ are, via an input buffer, input to the bases of the first and second NPN transistors Q1 and Q2, which constitute a differential pair so that the potential difference ($V_{IN}$ − $V_{ref}$) is amplified.

The amplified signal is input to the comparison/latch circuit on the rear stage. The input signal is, via an input buffer, input to the bases of the third and fourth NPN transistors Q3 and Q4, which constitute another differential pair. When the comparator driving signal $\phi$ is at the logical level "H", the input and the reference voltages are compared. If $V_{IN}$ is larger than $V_{ref}$, the output $Q_N$ becomes "H" and the output $Q_R$ becomes "L". Then, when the comparator driving signal $\phi$ becomes "L", the latch signal (inverse of the signal $\phi$) changes from "L" to "H" and keeps the same output.

The comparator circuit of FIG. 4 comprises 22 NPN transistors and 12 resistors. The number of comparator circuits needed for a parallel type A/D converter with N bits is $2^N - 1$. If N=10, 1023 comparator circuits are needed. In other words, the higher the resolution improves, the larger the required number of comparator circuits becomes.

When a large number of comparators are needed for a higher resolution, conventional comparator circuits with many elements as described above involve drawbacks of large chip size and increased current consumption.

SUMMARY OF THE INVENTION

An object of the present invention is to provide a comparator circuit which can be embodied with much less elements than conventional circuits and which works with reduced current consumption. Another object is to reduce the chip size and growth of current consumption even when many comparator circuits are required.

According to a preferred embodiment of the present invention to attain the above objects, a comparator circuit comprises first and second bipolar transistors for amplification of the input voltage and the reference voltage, first to fourth MOS type transistors for comparison and latching of the amplified input voltage and reference voltage according to the first driving signal and fifth and sixth MOS type transistors connected between the first and second bipolar transistors and the first to fourth MOS type transistors for turning on and off according to the second driving signal.

According to a further preferred embodiment of a comparator circuit according to the present invention, the first bipolar transistor has its base connected with the input voltage, its collector with the drain of the fifth MOS type transistor and its emitter with a constant current source, with such constant current source being connected with the second power supply, the second bipolar transistor has its base connected with the reference voltage, its collector with the drain of the sixth MOS type transistor and its emitter with the constant current source, the first MOS type transistor has its gate connected with the first driving signal, its source with the first power supply and its drain with the first output terminal, the second MOS type transistor has its gate connected with the second output terminal, its source with the first power supply and its drain with the first output terminal, the third MOS type transistor has its gate with the first output terminal, its source with the first power supply and its drain with the second output terminal, the fourth MOS type transistor has its gate connected with the first driving signal, its source with the first power supply and its drain with the second output terminal, the fifth MOS type transistor has its gate connected with the second driving signal and its source with the first output terminal and the sixth MOS type transistor has its gate connected with the second driving signal and its source with the second output terminal.

According to a further preferred embodiment, the first driving signal supplied to the first and the fourth MOS type transistors and the second driving signal supplied to the fifth and sixth MOS type transistors are clock signals with a time lag of certain time in the phase between them.

According to another preferred embodiment, the constant current source comprises a third bipolar type transistor having its collector connected with the emitters of the first and second bipolar type transistors, its emitter with the second power supply and its base connected with a third power supply.

Other objects, characteristics and effects of the present invention will be clarified in the detailed description below.

DESCRIPTION OF THE PREFERRED EMBODIMENT

Referring to the attached figures, preferred embodiment of the present invention will be described in detail.

Figure 1:
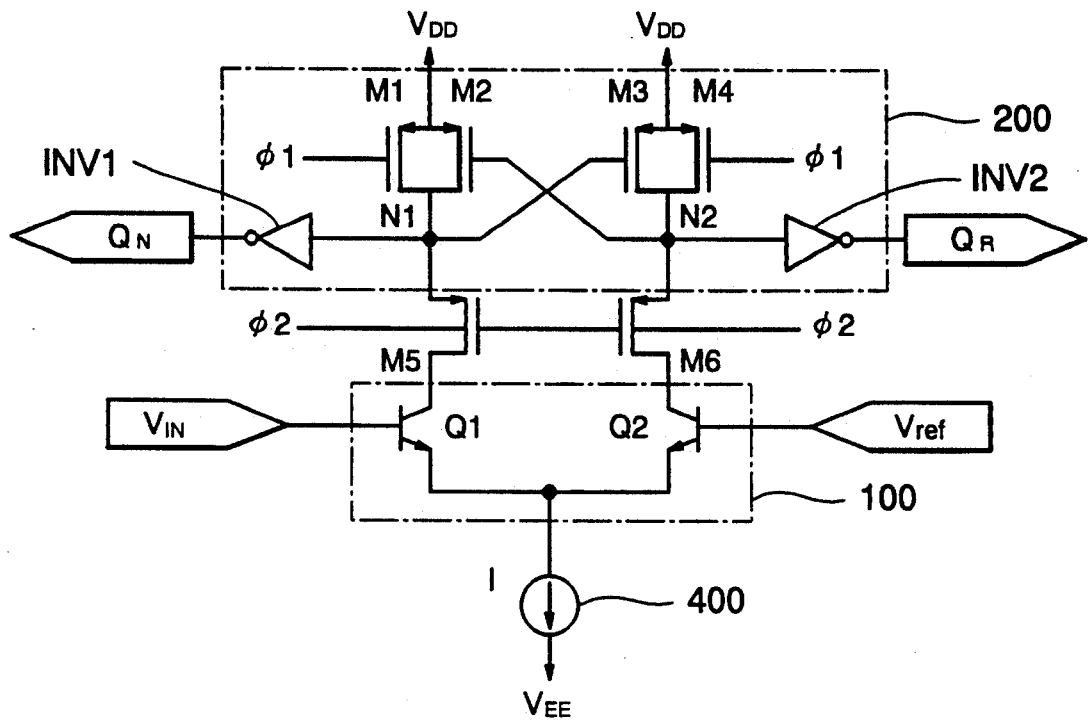
FIG. 1 is a schematic diagram of a comparator circuit according to a preferred embodiment of the present invention.

FIG. 1 shows the circuit configuration of a comparator circuit according to a preferred embodiment of the present invention.

In the figure, the comparator circuit comprises a comparison/latch section 200 and a pre-amplifier 100 both provided on a single stage.

The comparison/latch section 100 has four P-channel type MOS FETs M1 to M4. The first MOS FET M1 has its gate connected with the first driving clock signal $\phi 1$. Its source is connected with the first power source $V_{DD}$, and its drain is connected with the inverse output terminal N1, which makes a phase complementary to the input. At the second MOS FET M2, the gate is connected with the normal output terminal N2 which provides the same phase as the input, the source is connected with the first power supply $V_{DD}$ inverse and the drain is connected with the output terminal N1. At the third MOS FET M3, the gate is connected with the inverse output terminal N1, the source is connected with the first power supply $V_{DD}$, and the drain connected with the normal output terminal N2. For the fourth MOS FET M4, the gate is connected with the first driving clock signal $\phi 1$, the source with the first power supply $V_{DD}$, and the drain with the normal output terminal N2.

Further, the inverse output terminal N1 and the normal output terminal N2 are connected with the inverters INV1 and INV2 respectively and, via these converters INV1 and INV2, connected to the output terminals $Q_N$ and $Q_R$.

The pre-amplifier 100 comprises the first and the second NPN type bipolar transistors Q1 and Q2. At the bipolar transistor Q1, the base is connected with an input voltage terminal $V_{IN}$ and the emitter with a constant current circuit 400. At the bipolar transistor Q2, the base is connected with the reference voltage input terminal $V_{ref}$ and the emitter with the constant current circuit 400. The constant current circuit 400 is connected with the second power supply $V_{EE}$.

Between the comparison/latch section 200 and the pre-amplifier 100, fifth and sixth P-channel type MOS FETs M5 and M6 are provided. These fifth and sixth MOS FETs M5 and M6 have a resetting function to reset and initialize the comparison/latch section 200 and at the same time serve as load resistance for the pre-amplifier 100. At the fifth MOS FET M5, the gate is connected with the second driving clock signal $\phi 2$, the source with the inverse output terminal N1 and the drain with the collector of the first bipolar transistor Q1. At the sixth MOS FET M6, the gate is connected with the second driving clock signal $\phi 2$, the source with the normal output terminal N2 and the drain with the collector of the bipolar transistor Q2.

Figure 2:
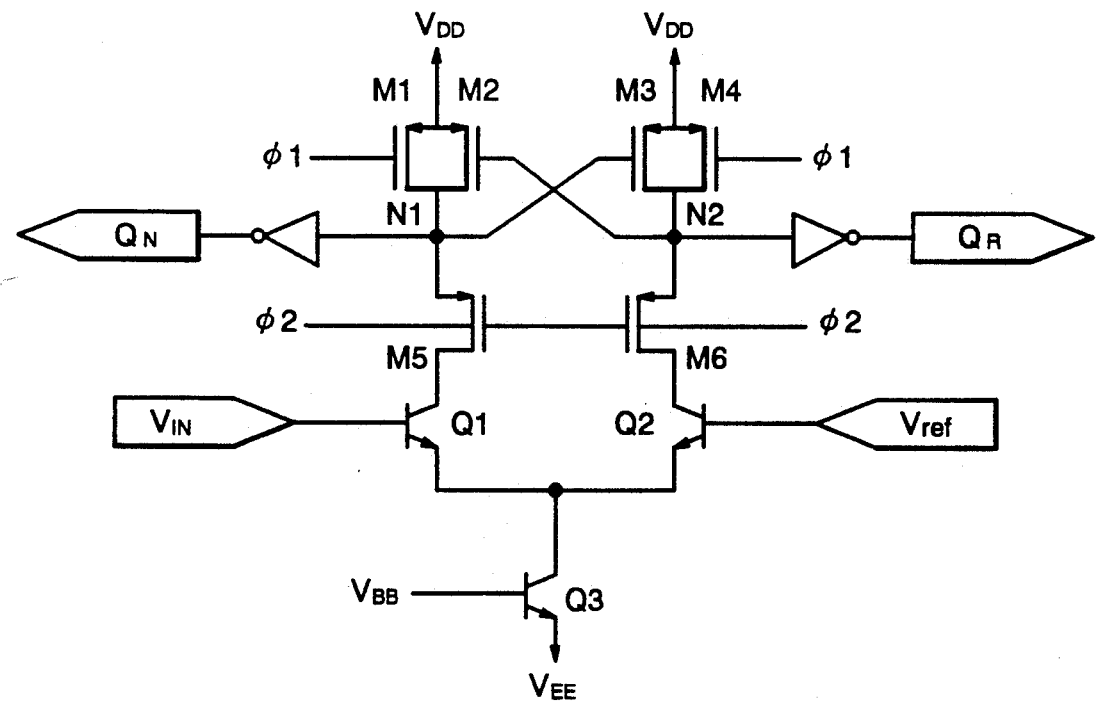
FIG. 2 is a schematic diagram of an embodied constant current circuit for the comparator circuit of FIG. 1.

FIG. 2 shows a comparator circuit with a constant current circuit 400 embodied. As shown in the figure, the constant current circuit 400 comprises an NPN type bipolar transistor Q3, whose base is connected with the third power supply $V_{BB}$.

Unlike a conventional comparator circuit with two stages (pre-amplifier stage and comparison/latch section stage), the comparator circuit according to this embodiment comprises, as described above, only three bipolar transistors and six MOS FETs (nine transistors in total). In short, it uses less elements than a conventional comparator circuit.

Figure 3:
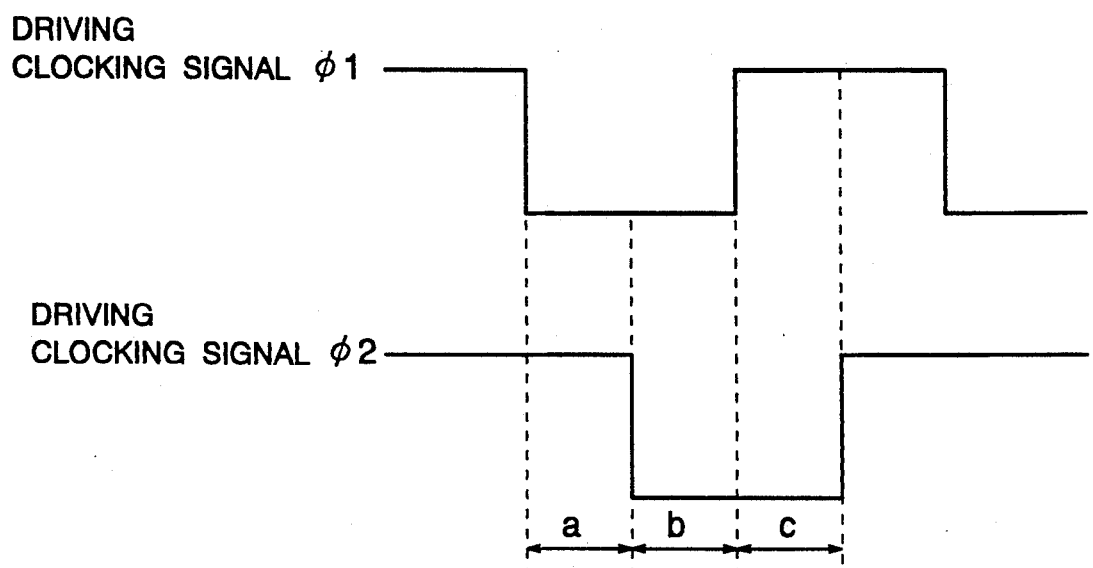
FIG. 3 is a timing chart of the driving clock signal supplied for driving of the comparator circuit and FIG. 4 is a schematic diagram to show an example of a conventional comparator circuit.
Figure 4:
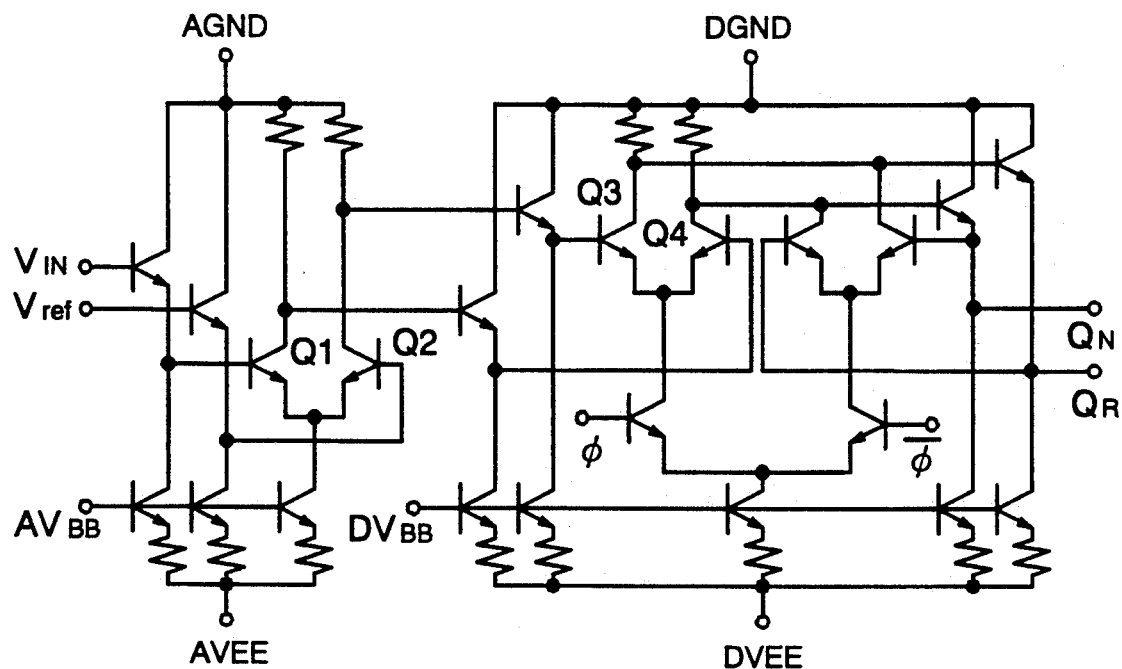

Next, the operation of this comparator circuit is described. FIG. 3 is a timing chart for the first and the second driving clock signals $\phi 1$ and $\phi 2$. As shown in the figure, driving clock signals $\phi 1$ and $\phi 2$ have the same pulse widths. The second driving clock signal $\phi 2$ has a delay of $\frac{1}{4}$ cycle from the first driving clock signal $\phi 1$ in the phase.

When the first and the second driving clock signals $\phi 1$ and $\phi 2$ are in the area a in FIG. 3, the first driving clock signal $\phi 1$ applied to the gates of the first and the fourth MOS FETs M1 and M4 is at low level "L", and turns on the MOS FETs M1 and M4. The driving clock signal $\phi 2$ applied to the gates of the fifth and the sixth MOS FETs M5 and M6 are at high level "H" and the MOS FETs M5 and M6 are turned off. Consequently, both of the inverse and normal output terminals become high level "H" and the output terminals $Q_N$ and $Q_R$ are made to low level "L" via inverters INV1 and INV2. The second and the third MOS FETs M2 and M3 are turned off since their gate voltages become "H". Such status where the first and the second driving clock signals $\phi 1$ and $\phi 2$ are in the area a is the reset mode.

When the first and the second driving clock signals $\phi 1$ and $\phi 2$ are in the area b, $\phi 1$ and $\phi 2$ are both at "L" and the MOS FETs M1, M4, M5 and M6 are turned on, which activates the circuit to make it enter the amplification mode. In this mode, the input voltage $V_{IN}$ and the reference voltage $V_{ref}$ input to the bases of the bipolar transistors Q1 and Q2 are amplified at the bipolar transistors Q1 and Q2 and supplied to the comparison/latch section 200.

When the first and the second driving clock signals $\phi 1$ and $\phi 2$ are in the area c, i.e. $\phi 1$="H" and $\phi 2$="L", the MOS FETs M1 and M2 are turned off and the MOS FETs M5 and M6 are turned on. This causes the entire circuit to enter the comparison/latch mode.

In the comparison/latch mode, the circuit operates as follows. Suppose the input voltage $V_{IN}$ is larger than the reference voltage $V_{ref}(V_{IN}>V_{ref})$. In this case, the current provided to the first bipolar transistor Q1 is larger than the current flowing to the second bipolar transistor Q2. The difference between the currents supplied to the bipolar transistors Q1 and Q2 raises the gate voltage at the MOS FET M2 and lowers the gate voltage at the MOS FET M3. As a result, the inverse output terminal N1 has the level "L" and the normal output terminal N2 has the level "H". At the output terminals $Q_N$ and $Q_R$, the values reversed at the inverters INV1 and INV2 are output. Consequently, the output terminal $Q_N$ becomes "H" and the output terminal $Q_R$ becomes "L". Thus, the comparison result that the input voltage $V_{IN}$ is larger than the reference voltage $V_{ref}$ is obtained.

If, on the contrary, the input voltage $V_{IN}$ is smaller than the reference voltage $V_{ref}(V_{IN}<V_{ref})$, the current provided to the second bipolar transistor Q2 is larger than that flowing to the first bipolar transistor Q1. The difference between the currents supplied to the bipolar transistors Q1 and Q2 lowers the gate voltage at the MOS FET M2 and raises the gate voltage at the MOS FET M3. As a result, the inverse output terminal N1 has the level "H" and the normal output terminal N2 has the level "L". Consequently, the output terminal $Q_N$ becomes "L" and $Q_R$ becomes "H". Thus, the comparison result to the effect that the input voltage $V_{IN}$ is smaller than the reference voltage $V_{ref}$ is obtained.

The values at the output terminals $Q_N$ and $Q_R$ output in the above comparison/latch mode are latched (kept) until the first and the second driving clock signals $\phi 1$ and $\phi 2$ enters the area a in FIG. 3.

When the first and the second driving clock signals $\phi 1$ and $\phi 2$ enters the status of the area a in FIG. 3, as described above, the MOS FETs M1 and M4, which have been turned off so far, are turned on and the MOS FETs M5 and M6, which have been turned of so far, are turned off. This causes the inverse and normal output terminals to become "H", and the output terminals $Q_N$ and $Q_R$ become "L". In other words, the comparison/latch section 100 is reset.

In the comparator circuit as described above, the MOS FETs M5 and M6 are repeatedly turned on and off according to the driving clock signal $\phi 2$. Consequently, each time the MOS FETs M5 and M6 are turned off, the collector current of the bipolar transistors Q1 and Q2 are periodically cut. Thus, in addition to the current consumption reduction resulting from a smaller number of elements, the power consumption can be further reduced effectively.

In general, there are some types of A/D converters with different architectures. Differences are mainly found in the configuration of the sample hold circuit and D/A subtraction circuit and the number of stages for parallel type A/D converter circuit and layout. It is common to all A/D converters, however, that a signal is processed through a comparator circuit, an encoder circuit and a D/A subtraction circuit. The above encoder circuit uses, inside the circuit, two driving signals with a lag less than several nanoseconds to drive the encoder matrix and the latch circuit on the output stage.

Therefore, when embodying this comparator circuit, there is no need of providing a new circuit to generate driving clock signals. The two driving signals used in the encoder circuit can be used as the driving clock signals $\phi 1$ and $\phi 2$.

Thus, the comparator circuit of this embodiment has less elements than conventional ones and can effectively reduce the increase of chip size and power consumption when a larger number of comparator circuits are required.

Obviously, various modifications can be made to the above embodiment. It is intended to cover in the appended claims all such modifications and variations as fall within the true spirit and scope of the present invention.

What is claimed is:

1. A comparator circuit comprising:
   first and second bipolar transistors for amplification of an input voltage and a reference voltage,
   first to fourth MOS type transistors for comparison and latching of an amplified input voltage and reference voltage according to a first driving signal, said first and fourth MOS type transistors being driven by said first driving signal and said second and third MOS type transistors connected respectively in parallel with said first and fourth MOS type transistors and receiving said amplified reference voltage and input voltage, and
   fifth and sixth MOS type transistors respectively connected between said first and second bipolar transistors and said first and second and between said third and fourth MOS type transistors for turning on and off according to a second driving signal.

2. A comparator circuit of claim 1 wherein said first bipolar transistor has a base connected with said input voltage, a collector with a drain of said fifth MOS type transistor and an emitter with a constant current source, and such constant current source being connected with a second power supply, said second bipolar transistor has a base connected with said reference voltage, a collector with a drain of said sixth MOS type transistor and an emitter with said constant current source,
   said first MOS type transistor has a gate connected with said first driving signal, a source with a first power supply and a drain with a first output terminal,
   said second MOS type transistor has a gate connected with a second output terminal, a source with said first power supply and a drain with said first output terminal,
   said third MOS type transistor has a gate connected with said first output terminal, a source with said first power supply and a drain with said second output terminal,
   said fourth MOS type transistor has a gate connected with said first driving signal, a source with said first power supply and a drain with said second output terminal,
   said fifth MOS type transistor has a gate connected with said second driving signal and a source with said first output terminal, and
   said sixth MOS type transistor has a gate connected with said second driving signal and a source with said second output terminal.

3. A comparator circuit of claim 1 wherein said first and second driving signals are clock signals with a lag of certain time in the phase.

4. A comparator circuit of claim 2 wherein said constant current source comprises a third bipolar type transistor having a collector connected with the emitters of said first and second bipolar type transistors, an emitter with said second power supply and a base with a third power supply.

* * * * *